(12) United States Patent
Togawa

(10) Patent No.: US 10,978,998 B2
(45) Date of Patent: Apr. 13, 2021

(54) AMPLIFYING DEVICE AND CONTROLLING METHOD THEREFOR

(71) Applicant: Yamaha Corporation, Hamamatsu (JP)

(72) Inventor: Takeshi Togawa, Anjo (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 16/720,388

(22) Filed: Dec. 19, 2019

(65) Prior Publication Data

US 2020/0127606 A1 Apr. 23, 2020

Related U.S. Application Data

(63) Continuation of application No. PCT/JP2017/024344, filed on Jul. 3, 2017.

(51) Int. Cl.
| | | |
|---|---|---|
| *H03F 1/02* | (2006.01) | |
| *H03F 3/68* | (2006.01) | |
| *H03F 3/20* | (2006.01) | |
| *H03G 3/30* | (2006.01) | |

(52) U.S. Cl.
CPC ............. *H03F 1/02* (2013.01); *H03F 3/20* (2013.01); *H03F 3/68* (2013.01); *H03G 3/3005* (2013.01); *H03F 2200/03* (2013.01); *H03F 2200/462* (2013.01); *H03F 2200/471* (2013.01)

(58) Field of Classification Search
CPC ..... H03F 1/02; H03F 3/20; H03F 3/68; H03F 2200/03; H03F 2200/462; H03F 2200/471; H03F 2200/211; H03F 2200/411; H03F 3/181; H03G 3/3005; H03G 11/04; H03G 7/002; H03G 7/06

USPC ........................ 330/10, 251, 207 A, 302, 310
See application file for complete search history.

(56) References Cited

U.S. PATENT DOCUMENTS

| 5,729,611 | A | * | 3/1998 | Bonneville | ............... | H03F 1/52 |
| | | | | | | 381/55 |
| 9,154,101 | B2 | * | 10/2015 | Dhuyvetter | .......... | H03G 11/002 |
| 2004/0135635 | A1 | | 7/2004 | Noro | | |

FOREIGN PATENT DOCUMENTS

JP 2004-214793 A 7/2004

OTHER PUBLICATIONS

International Search Report (PCT/ISA/210) issued in PCT Application No. PCT/JP2017/024344 dated Sep. 19, 2017 with English translation (four (4) pages).

(Continued)

*Primary Examiner* — Hieu P Nguyen
(74) *Attorney, Agent, or Firm* — Crowell & Moring LLP

(57) ABSTRACT

An amplifying device includes a first amplifier, a voltage-limiting circuit, a second amplifier, a first controller, and a second controller. The first amplifier is configured to amplify an input signal. The voltage-limiting circuit is configured to limit a voltage of an output signal from the first amplifier to within a limit range. The second amplifier is configured to amplify an output signal from the voltage-limiting circuit. The first controller is configured to control the limit range in accordance with a current supplied to a load from the second amplifier. The second controller is configured to decrease an amplification factor of the first amplifier in a state in which the voltage-limiting circuit limits the voltage of the output signal from the first amplifier.

4 Claims, 6 Drawing Sheets

(56) References Cited

OTHER PUBLICATIONS

Japanese-language Written Opinion (PCT/ISA/237) issued in PCT Application No. PCT/JP2017/024344 dated Sep. 19, 2017 (four (4) pages).
Japanese-language Office Action issued in Japanese Application No. 2019-528198 dated Sep. 29, 2020 with English translation (four (4) pages).

* cited by examiner

AMPLIFYING DEVICE AND CONTROLLING METHOD THEREFOR

CROSS REFERENCE TO RELATED APPLICATION

This application is a Continuation Application of PCT Application No. PCT/JP2017/024344, filed Jul. 3, 2017, the entire contents of which are incorporated herein by reference.

BACKGROUND

Field of the Invention

The embodiments of the present invention relate to technology for amplifying audio signals.

Description of Related Art

Various configurations for amplifying audio signals have been proposed heretofore. For example, there is a device including a voltage-limiting circuit that limits the voltage of an input signal and an amplifier circuit that amplifies an output signal from the voltage-limiting circuit. The limit range of a voltage by the voltage-limiting circuit is controlled in accordance with an output current supplied to a load from the amplifier circuit. In the above configuration, changes in the maximum output power can be reduced even if a load impedance has changed, by appropriately adjusting correspondence between the output current and a clamping voltage.

However, even in a state in which the voltage-limiting circuit limits the voltage of an input signal, if a level of the input signal (specifically, a voltage amplitude) increases, a waveform of an output signal is deformed, and thus, the maximum output power may change. For example, in a state in which the voltage-limiting circuit limits the voltage of a sine-wave input signal, as the level of the input signal increases, a period in which the voltage of the input signal is clipped within one cycle is longer. Therefore, the waveform of the output signal is similar to a square wave. The square wave has larger effective power than the sine wave, even if the amplitude is the same. Therefore, in practice, the maximum output power increases.

SUMMARY

In view of the above circumstances, an object of an aspect according to the present invention is to reduce changes in the maximum output power corresponding to a load impedance.

In order to solve the above problem, an inventive amplifying device includes a first amplifier configured to amplify an input signal; a voltage-limiting circuit configured to limit a voltage of an output signal from the first amplifier to within a limit range; a second amplifier configured to amplify an output signal from the voltage-limiting circuit; a first controller configured to control the limit range in accordance with a current supplied to a load from the second amplifier; and a second controller configured to decrease an amplification factor of the first amplifier in a state in which the voltage-limiting circuit limits the voltage of the output signal from the first amplifier.

An inventive control method of an amplifying device includes a first amplifier configured to amplify an input signal; a voltage-limiting circuit configured to limit a voltage of an output signal from the first amplifier to within a limit range; and a second amplifier configured to amplify an output signal from the voltage-limiting circuit, in which the controlling method includes: controlling the limit range in accordance with a current supplied to a load from the second amplifier; and decreasing an amplification factor of the first amplifier in a state in which the voltage-limiting circuit limits the voltage of the output signal from the first amplifier.

DESCRIPTION OF EMBODIMENTS

Figure 1:
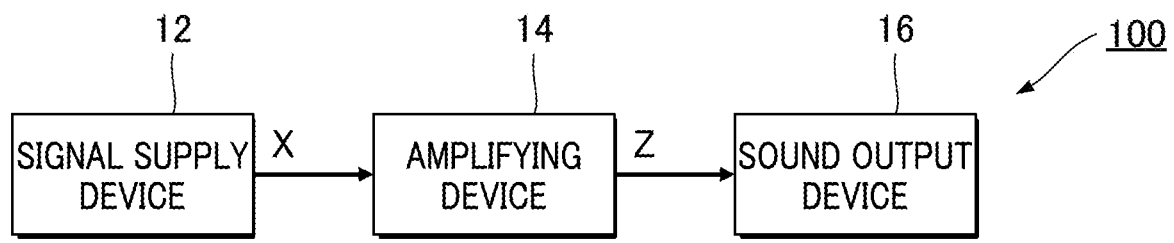
FIG. 1 is a block diagram showing a configuration of an inventive audio system.

FIG. 1 is a block diagram showing a configuration of an inventive audio system 100. The audio system 100 is one that plays various sounds such as musical sounds or voice sounds. As shown in FIG. 1, the audio system 100 includes a signal supply device 12, an amplifying device 14, and a sound output device 16. It is to be noted that any two or more elements of the audio system 100 may be integrally formed.

The signal supply device 12 is a signal source that supplies an audio signal X (an example of an input signal) representative of various sounds, such as voice sounds or musical sounds, to the amplifying device 14. For example, a reproduction device that reads out the audio signal X from a portable or built-in recording medium is an example of the signal supply device 12. Furthermore, there may be used, as the signal supply device 12, a sound pickup device that picks up peripheral sounds to generate an audio signal X, or a communication device that receives the audio signal X from another device via a communication network.

The amplifying device 14 is an audio processing device that generates an audio signal Z by amplifying the audio signal X supplied from the signal supply device 12. The amplifying device 14 may be provided with a signal processing circuit that performs various types of signal processing such as equalizer processing with respect to the audio signal X. The sound output device 16 is, for example, a speaker or a headphone, and plays the audio signal Z generated by the amplifying device 14. An impedance of the sound output device 16 is hereinafter noted as "load impedance".

Figure 2:
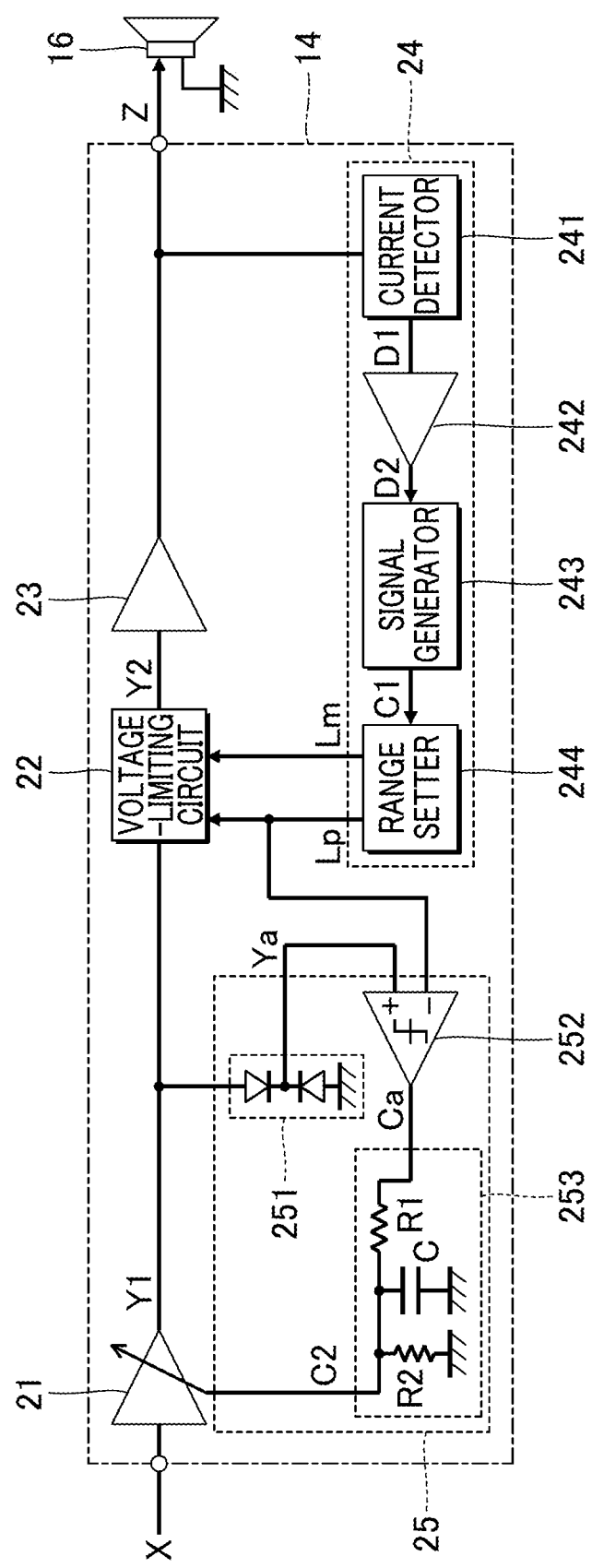
FIG. 2 is a block diagram showing a configuration of an inventive amplifying device.

FIG. 2 is a block diagram showing a configuration of the amplifying device 14. As shown in FIG. 2, the amplifying device 14 includes a first amplifier 21, a voltage-limiting circuit 22, a second amplifier 23, a first controller 24, and a second controller 25.

The first amplifier 21 amplifies a voltage of an audio signal X supplied from the signal supply device 12 to generate an audio signal Y1. The first amplifier 21 is a voltage controlled amplifier circuit (VCA: Voltage Controlled Amplifier) that changes an amplification factor (a voltage gain) G thereof. Specifically, the amplification factor G of the first amplifier 21 is changed in accordance with a control signal C2 supplied from the second controller 25.

Figure 3:
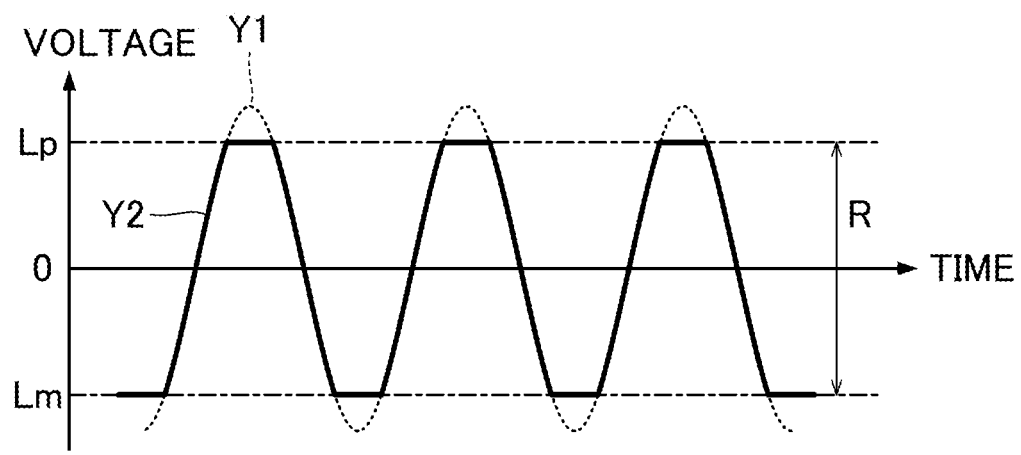
FIG. 3 is a waveform chart for explaining an operation of a voltage-limiting circuit.

The voltage-limiting circuit 22 is a limiter that limits the amplitude of the audio signal Y1 amplified by the first amplifier 21. FIG. 3 is an explanatory diagram of an operation of the voltage-limiting circuit 22 in a case in which the audio signal X is assumed to be a sine wave. In FIG. 3, the audio signal Y1 before being processed by the voltage-limiting circuit 22 (a broken line), and an audio signal Y2 (a solid line) after being processed, are shown together. As shown in FIG. 3, the voltage-limiting circuit 22 generates an audio signal Y2 by limiting the voltage of the audio signal Y1 to within a range (hereinafter, "limit range") R. The limit range R has a positive limit value Lp as an upper limit and a negative limit value Lm as a lower limit. Specifically, when the voltage of the audio signal Y1 exceeds the limit value Lp, the voltage of the audio signal Y2 is limited to the limit value Lp. Furthermore, when the voltage of the audio signal Y1 falls below the limit value Lm, the voltage of the audio signal Y2 is limited to the limit value Lm. In other words, when the voltage of the audio signal Y1 has reached beyond the limit range R, the voltage-limiting circuit 22 will be in a state of limiting the voltage to within the limit range R (hereinafter, "limiting operation state"). On the other hand, when the voltage of the audio signal Y1 is within the limit range R, the audio signal Y1 is output to the second amplifier 23 as the audio signal Y2. That is, the audio signal Y1 is output to the second amplifier 23 as the audio signal Y2 without limiting the voltage thereof.

The second amplifier 23 shown in FIG. 2 amplifies the audio signal Y2 output by the voltage-limiting circuit 22. Specifically, the second amplifier 23 may be a class D amplifier. The class D amplifier includes a modulation circuit, a switch circuit, and a low-pass filter. The modulation circuit generates a binary modulation signal by applying pulse modulation to the audio signal Y2. The switch circuit amplifies the modulation signal generated by a switching operation. The low-pass filter generates an audio signal Z by extracting low-frequency components of the amplified signal. The configuration of the second amplifier 23 is freely selectable. For example, a class A amplifier, a class B amplifier, or a class AB amplifier may be used as the second amplifier 23. The audio signal Z amplified by the second amplifier 23 is supplied to the sound output device 16 (that is, load).

The first controller 24 shown in FIG. 2 controls the limit range R of the voltage-limiting circuit 22 in accordance with a current (hereinafter, "output current") supplied to the sound output device 16 from the second amplifier 23. Specifically, the first controller 24 controls the voltage-limiting circuit 22 in such a manner that the limit range R becomes narrower as the output current from the second amplifier 23 increases (that is, as the load impedance decreases). That is, the limit range R is inversely proportional to the output current.

The first controller 24 sets the limit value Lp and the limit value Lm in accordance with an output current supplied to the sound output device 16 from the second amplifier 23. As shown in FIG. 2, the first controller 24 includes a current detector 241, a voltage adjuster 242, a signal generator 243, and a range setter 244.

The current detector 241 outputs a voltage D1 corresponding to an output current. Hereinafter, the voltage D1 will be called "detection voltage". For example, there is a resistor element (not shown) interposed in a current path in which the output current flows. In this case, the current detector 241 detects a voltage across the ends of the resistor element. The voltage adjuster 242 generates a detection voltage D2 by adjusting the detection voltage D1. Specifically, the amplifier circuit that amplifies the detection voltage D1 is used as the voltage adjuster 242. The amplification factor of the voltage adjuster 242 is variable. For example, the amplification factor of the voltage adjuster 242 is set in response to an instruction from a user.

The signal generator 243 generates a control signal C1 from the detection voltage D2 adjusted by the voltage adjuster 242. Specifically, the signal generator 243 generates a DC voltage as the control signal C1 by rectifying (specifically, full-wave rectifying) and smoothing the detection voltage D2. As is understood from the above descriptions, the control signal C1 is a voltage signal set to a voltage corresponding to the output current.

The range setter 244 sets the limit range R (the limit value Lp and the limit value Lm) in accordance with the control signal C1 generated by the signal generator 243. Specifically, the range setter 244 sets the limit value Lp to a lower voltage, as the voltage of the control signal C1 increases (that is, the output current increases). That is, the limit range R decreases in size. Furthermore, the range setter 244 sets the limit value Lm to a higher voltage as the voltage of the control signal C1 increases (that is, the output current increases). That is, the limit range R decreases in size. As is understood from the above descriptions, as a current amount of an output current from the second amplifier 23 increases (that is, the load impedance decreases), the limit range R of the voltage-limiting circuit 22 is controlled to a narrower range. If the limit range R (the voltage amplitude) is in a relation proportional to the output current, the output voltage hardly changes even if the output current changes. Even if the load impedance changes, for example, due to replacement of the sound output device 16, changes in the maximum output power of the amplifying device 14 can be reduced.

Figure 4:
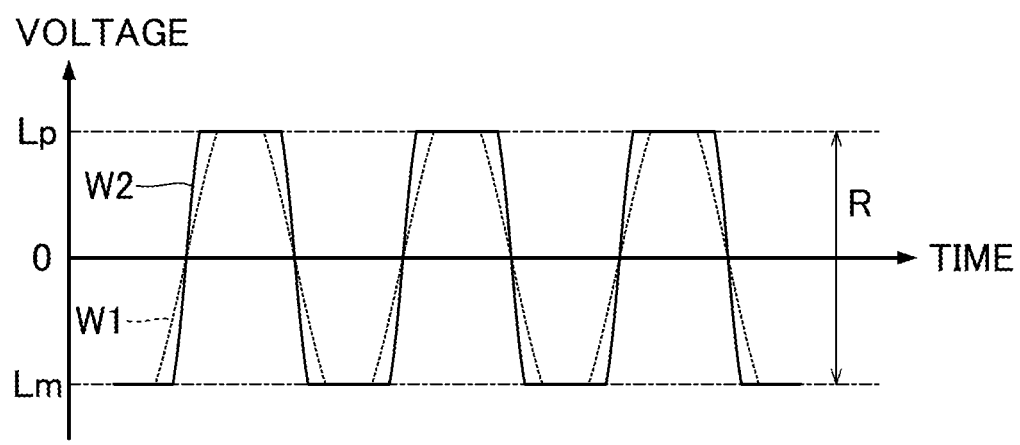
FIG. 4 is a waveform chart for explaining a state of change in a waveform of an audio signal Y2 in a limiting operation state.

However, in a limiting operation state in which voltage limiting (clipping) by the voltage-limiting circuit 22 is active, as described below, when the level (for example, the voltage amplitude) of the audio signal X increases, a waveform of the audio signal Y2 is deformed. FIG. 4 is a waveform chart of the audio signal Y2 when the audio signal X is assumed to be a sine wave. A waveform W1 in FIG. 4 is a waveform of the audio signal Y2 in which the voltage is limited to the limit range R by the voltage-limiting circuit 22. When the level of the audio signal X is forcibly increased from the state of the waveform W1, as shown as a waveform W2 in FIG. 4, a period of time during which the voltage is limited (clipped) increases. It is to be noted that the period of time during which the voltage is limited means a ratio of a period of time during which the limiting operation state continues to the unit time. In other words, since a time during which the waveform is maintained horizontal in the audio signal Y2 is longer, the waveform of the audio signal Y2 changes from the sine wave to a waveform similar to a square wave. Therefore, the maximum output voltage changes in practice, despite the configuration described above in which the limit range R is controlled in accordance with the output current from the second amplifier 23. For example, when the audio signal Y2 changes from the sine wave to a waveform similar to a square wave, the maximum output power increases to about 1.5 times (theoretically, 2 times).

In view of the above circumstances, the second controller 25 decreases the amplification factor G of the first amplifier 21, when the voltage-limiting circuit 22 is in a limiting operation state (that is, when voltage limiting by the voltage-limiting circuit 22 is active). Specifically, the second controller 25 includes, as shown in FIG. 2, a rectifier circuit 251, a limiting detector 252, and a signal generator 253. The following descriptions assume a case in which an absolute value of the limit value Lm is equal to the limit value Lp.

Figure 5:
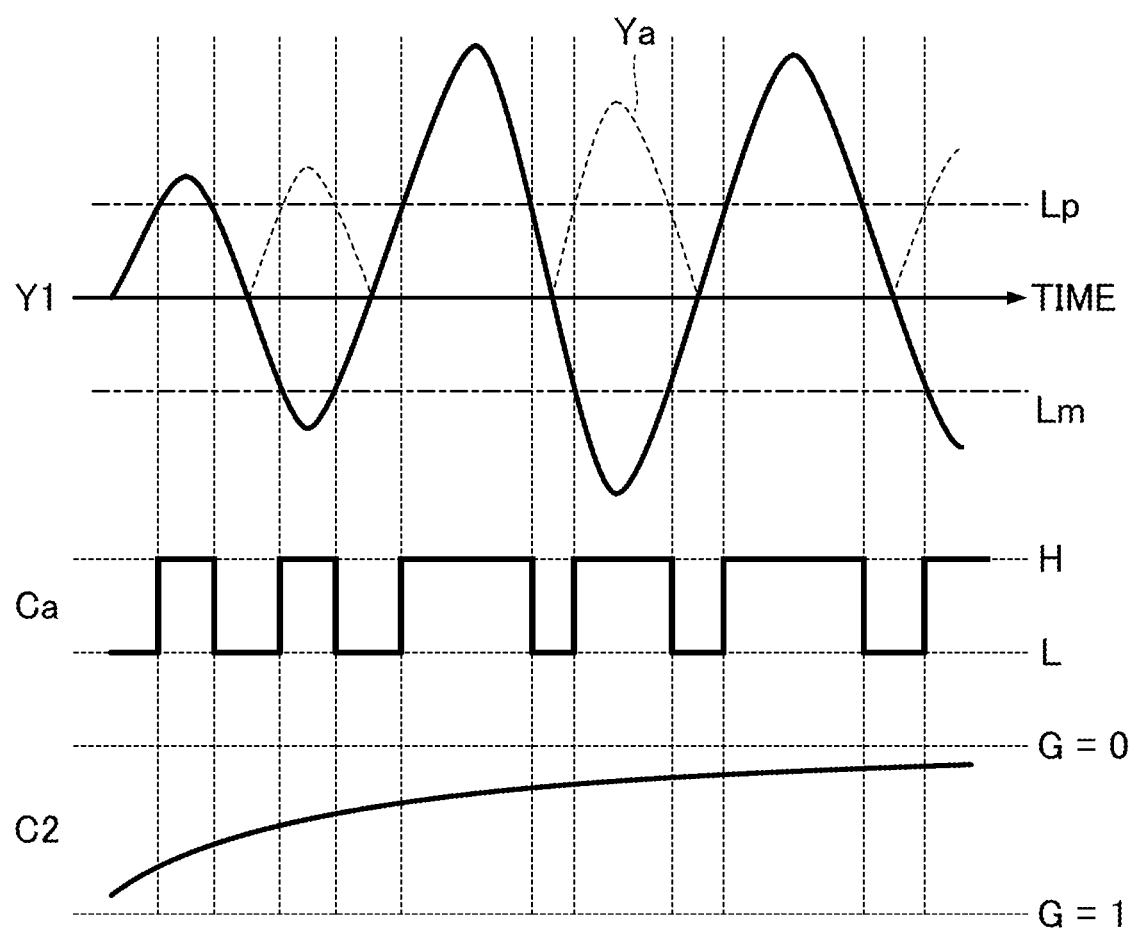
FIG. 5 is an explanatory diagram of an operation of a second controller.

FIG. 5 is an explanatory diagram of an operation of the second controller 25. The rectifier circuit 251 is configured by, for example, a plurality of diodes. The rectifier circuit 251 generates an audio signal Ya by applying full-wave rectification to the audio signal Y1 amplified by the first amplifier 21. The limiting detector 252 detects that the voltage-limiting circuit 22 is in a limiting operation state. Specifically, the limiting detector 252 is a comparison circuit that compares the audio signal Ya rectified by the rectifier circuit 251 with the limit value Lp set by the range setter 244. A control signal Ca corresponding to a comparison result obtained by comparing the audio signal Ya with the limit value Lp is supplied to the signal generator 253 from the limiting detector 252. The control signal Ca is a binary signal. As shown in FIG. 5, the control signal Ca is set to a high level when the voltage of the audio signal Ya exceeds the limit value Lp (when the voltage of the audio signal Y1 exceeds the limit value Lp or falls below the limit value Lm), and is set to a low level when the voltage of the audio signal Ya falls below the limit value Lp. When the audio signal Ya exceeds the limit value Lp, the voltage-limiting circuit 22 is in a limiting operation state. Therefore, the control signal Ca being at a high level means that the voltage-limiting circuit 22 is in a limiting operation state. In other words, the limiting detector 252 detects that the voltage-limiting circuit 22 is in a limiting operation state, as described above.

The signal generator 253 shown in FIG. 2 controls the amplification factor G of the first amplifier 21 in accordance with the control signal Ca generated by the limiting detector 252. Specifically, the signal generator 253 decreases the amplification factor G of the first amplifier 21 when the control signal Ca indicates a limiting operation state (that is, when voltage limiting by the voltage-limiting circuit 22 is active).

As shown in FIG. 2, the signal generator 253 is a smoothing circuit (a low-pass filter) configured by a resistor element R1, a resistor element R2, and a capacitor C. That is, the signal generator 253 outputs a control signal C2 obtained by smoothing the control signal Ca supplied from the limiting detector 252. The control signal C2 is a voltage signal with a voltage value changing continuously, whereas the control signal Ca is a binary signal. Specifically, as shown in FIG. 5, as a period of time during which the voltage-limiting circuit 22 is in the limiting operation state increases, the control signal C2 is set to a higher level. As the level of the control signal C2 generated by the signal generator 253 is higher, the amplification factor G of the first amplifier 21 is set to a smaller value.

In the above configuration, when the voltage of the audio signal Y1 is within the limit range R (that is, when the voltage-limiting circuit 22 is not in a limiting operation state), the control signal Ca is maintained at a low level. Therefore, the level of the control signal C2 is maintained at a minimum value. Accordingly, the amplification factor G of the first amplifier 21 is set to a maximum value 1. On the other hand, when the voltage of the audio signal Ya exceeds the limit value Lp (that is, when the voltage-limiting circuit 22 is in a limiting operation state), the control signal Ca is maintained at a high level. Therefore, the level of the control signal C2 increases over time. Accordingly, the amplification factor G of the first amplifier 21 decreases. As is understood from the foregoing descriptions, the second controller 25 controls the amplification factor G of the first amplifier 21 in accordance with a period of time during which the voltage-limiting circuit 22 limits the voltage (that is, the voltage of the output signal from the first amplifier). Specifically, the second controller 25 sets the amplification factor G of the first amplifier 21 to a smaller value, as the period of time during which the voltage-limiting circuit 22 limits the voltage increases. It is to be noted that there may be provided a processor executing a program stored in a memory circuit. In this case, the following processing may be realized by the processor. Specifically, the processor may execute the processing to decrease the amplification factor G of the first amplifier 21 when the voltage-limiting circuit 22 is in a limiting operation state.

Figure 6:
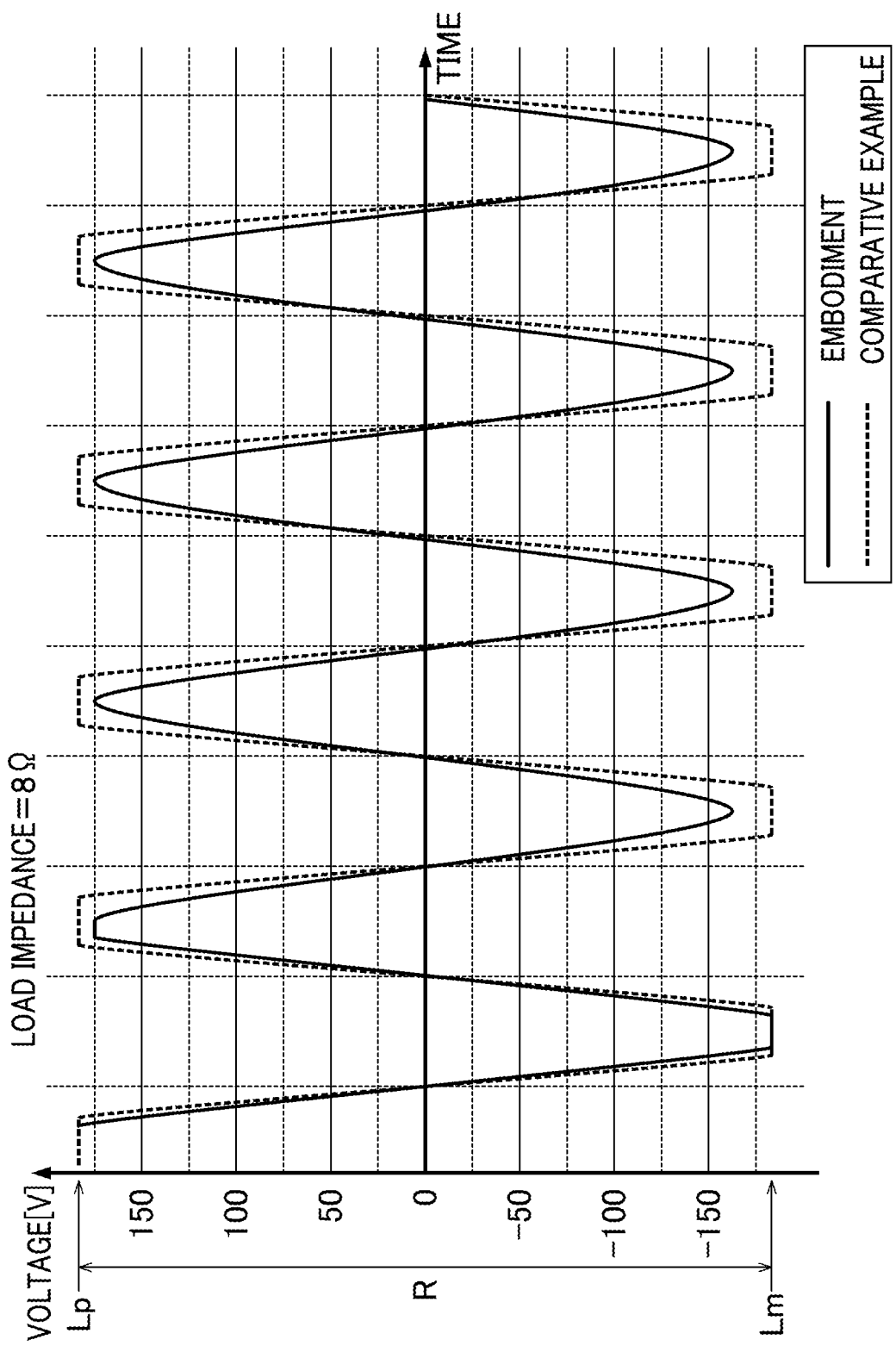
FIG. 6 is a waveform chart of an audio signal Y2 when a load impedance is high.
Figure 7:
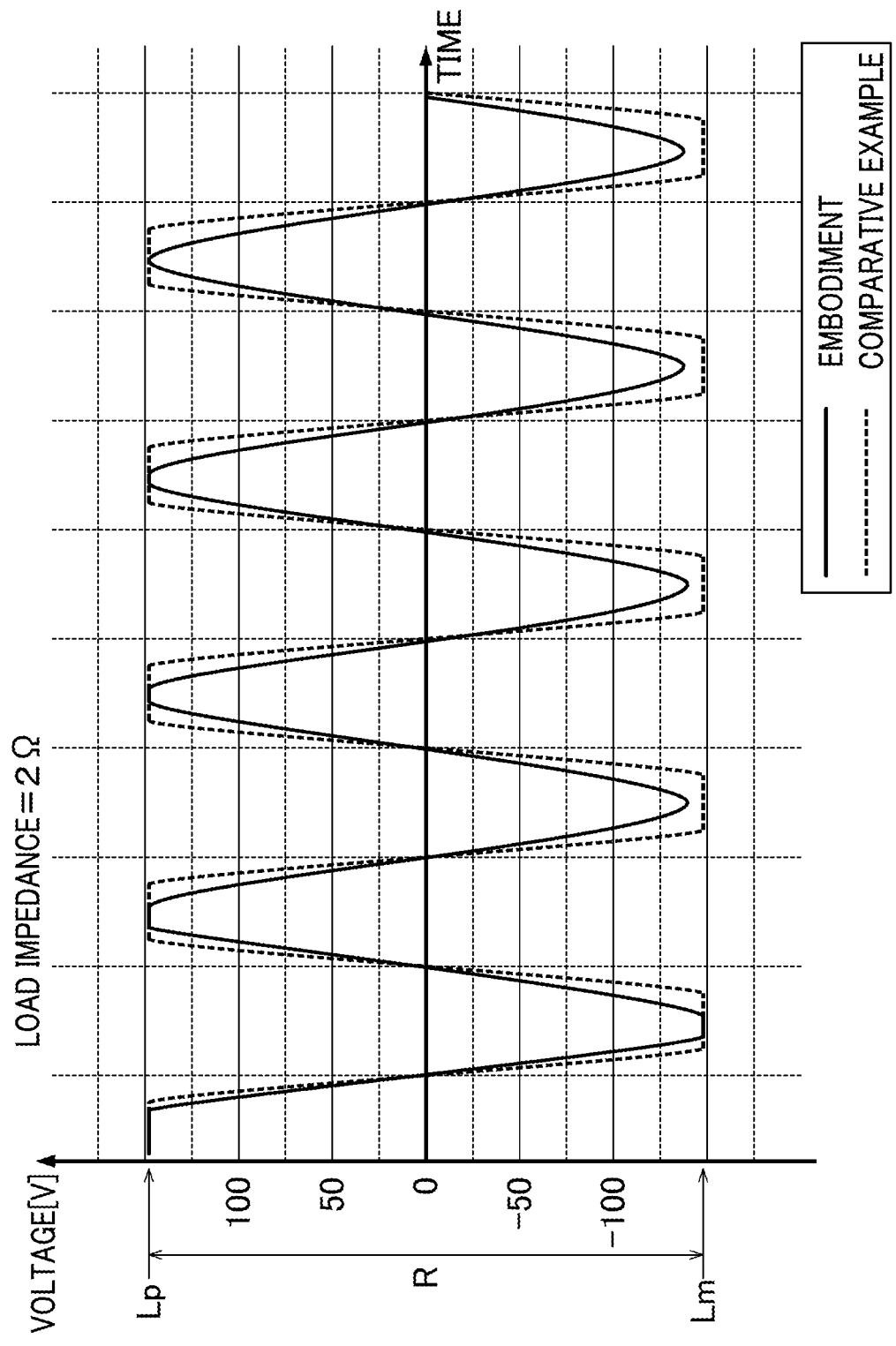
FIG. 7 is a waveform chart of an audio signal Y2 when a load impedance is low.

FIG. 6 and FIG. 7 each is a waveform chart of the audio signal Y2 output by the voltage-limiting circuit 22 when a sine wave is supplied to the first amplifier 21 as an audio signal X. Furthermore, in each of FIG. 6 and FIG. 7, a solid line represents a waveform of the audio signal Y2 in a comparative example of a case in which the amplification factor G of the first amplifier 21 is fixed, and a broken-line represents a waveform of the audio signal Y2 in which the amplification factor G is decreased when the voltage-limiting circuit 22 is in the limiting operation state. The comparative example corresponds to, for example, the configuration of Patent Document 1. Furthermore, a case in which the load impedance is 8Ω is assumed in FIG. 6 and a case in which the load impedance is 2Ω is assumed in FIG. 7. The following will be found from FIG. 6 and FIG. 7. As described above, the limit range R is narrower as the output current increases. Accordingly, as the load impedance decreases, the output current increases. As a result, the limit range R of the voltage-limiting circuit 22 is controlled to a narrow range.

When the broken-line of the waveform shown in FIG. 6 is compared with that shown in FIG. 7, the time during which the voltage is limited is longer in a state in which the limit range R is narrower in FIG. 7, even with the same audio signal Y1. That is, the time during which the waveform is horizontal is long. In other words, in the comparative example, it can be found that when the signal level of the audio signal X is increased in a limiting operation state, the audio signal Y2 has a waveform similar to a square wave in the case in which the load impedance is small. Due to a difference in the waveforms, the maximum output power differs between the case in which the load impedance is large (8Ω) and the case in which the load impedance is small (2Ω). On the other hand, as shown by the solid line in FIG. 6 and FIG. 7, since the second controller 25 decreases the amplification factor G of the first amplifier 21 in a limiting operation state, the waveform of the audio signal Y2 is maintained to the sine wave. Therefore, there is reduction in the difference in the maximum output power between the case in which the load impedance is large (8Ω) and the case in which the load impedance is small (2Ω), as compared with the comparative example. In other words, there is an advantage in that the probability is reduced that the maximum output power becomes excessive, and as a result, load such as excessive heat generation of the amplifying device 14 can be decreased.

Particularly, the amplification factor G of the first amplifier 21 is controlled in accordance with a period of time during which the voltage-limiting circuit 22 is in a voltage limiting state. Specifically, as the period of time in a voltage limiting state increases, the amplification factor G decreases. Accordingly, the above-described effect of enabling reduction of changes in the maximum output power is noticeable. Furthermore, the detection voltage D1 corresponding to an output current from the second amplifier 23 is adjusted by the voltage adjuster 242, and the control signal C1 is generated by rectifying and smoothing the adjusted detection voltage D2. Therefore, the relationship between the detection voltage D1 and the limit range R can be changed in accordance with the degree of adjustment (specifically, the amplification factor) by the voltage adjuster 242. For example, the amplification factor of the voltage adjuster 242 is set in accordance with a target value of the maximum output power.

The following configurations are understood as examples from the embodiment detailed above. An inventive amplifying device may include a first amplifier configured to amplify an input signal; a voltage-limiting circuit configured to limit a voltage of an output signal from the first amplifier to within a limit range; a second amplifier configured to amplify an output signal from the voltage-limiting circuit; a first controller configured to control the limit range in accordance with a current supplied to a load from the second amplifier; and a second controller configured to decrease an amplification factor of the first amplifier in a state in which the voltage-limiting circuit limits the voltage of the output signal from the first amplifier.

Since the limit range is controlled according to the current supplied to the load from the second amplifier, changes in the maximum output power due to a change in a load impedance can be reduced. Furthermore, the amplification factor of the first amplifier decreases in a state in which the voltage of the output signal from the first amplifier is limited. Therefore, even if the signal level of an input signal increases in a state in which the voltage of the output signal from the first amplifier is limited, changes in the maximum output power can be reduced.

The second controller may be configured to control an amplification factor of the first amplifier in accordance with a period of time during which the voltage-limiting circuit limits the voltage of the output signal.

Since the amplification factor of the first amplifier is controlled in accordance with the period of time during which the voltage-limiting circuit limits the voltage of the output signal from the first amplifier, the above-described effect of enabling reduction in changes in the maximum output power is notable. Specifically, as the period of time during which the voltage-limiting circuit limits the voltage of the output signal increases, the amplification factor of the first amplifier decreases.

The first controller may include a current detector configured to generate a detection voltage corresponding to the current supplied to the load from the second amplifier; a voltage adjuster configured to adjust the detection voltage; a signal generator configured to generate a control signal by rectifying and smoothing the detection voltage adjusted by the voltage adjuster; and a range setter configured to control the limit range in accordance with the control signal.

The detection voltage corresponding to the current supplied to the load from the second amplifier is adjusted, and the adjusted voltage is rectified and smoothed to generate the control signal that defines the limit range. Therefore, the relationship between the detection voltage and the limit range can be changed in accordance with the degree of adjustment by the voltage adjuster.

An inventive controlling method of an amplifying device may include a first amplifier configured to amplify an input signal; a voltage-limiting circuit configured to limit a voltage of an output signal from the first amplifier to within a limit range; and a second amplifier configured to amplify an output signal from the voltage-limiting circuit, in which the controlling method includes: controlling the limit range in accordance with a current supplied to a load from the second amplifier; and decreasing an amplification factor of the first amplifier in a state in which the voltage-limiting circuit limits a voltage of an output signal from the first amplifier.

Since the limit range is controlled according to the current supplied to the load from the second amplifier, there is a reduction in changes in the maximum output power due to a change in the load impedance. Furthermore, the amplification factor of the first amplifier decreases in a state in which the voltage of the output signal from the first amplifier is limited. Therefore, even if the signal level of an input signal increases in a state in which the voltage of the output signal from the first amplifier is limited, changes in the maximum output power can be reduced.

DESCRIPTION OF REFERENCE SIGNS

100 . . . audio system, 12 . . . signal supplying device, 14 . . . amplifying device, 16 . . . sound output device, 21 . . . first amplifier, 22 . . . voltage-limiting circuit, 23 . . . second amplifier, 24 . . . first controller, 241 . . . current detector, 242 . . . voltage adjustor, 243 . . . signal generator, 244 . . . range setter, 25 . . . second controller, 251 . . . rectifier circuit, 252 . . . limiting detector, 253 . . . signal generator.

What is claimed is:

1. An amplifying device comprising:
   a first amplifier configured to amplify an input signal;
   a voltage-limiting circuit configured to limit a voltage of an output signal from the first amplifier to within a limit range;
   a second amplifier configured to amplify an output signal from the voltage-limiting circuit;
   a first controller configured to control the limit range in accordance with a current supplied to a load from the second amplifier; and
   a second controller configured to decrease an amplification factor of the first amplifier in a state in which the voltage-limiting circuit limits the voltage of the output signal from the first amplifier.

2. The amplifying device according to claim 1, wherein the second controller is configured to control an amplification factor of the first amplifier in accordance with a period of time during which the voltage-limiting circuit limits the voltage of the output signal.

3. The amplifying device according to claim 1, wherein the first controller includes:
   a current detector configured to generate a detection voltage corresponding to the current supplied to the load from the second amplifier;
   a voltage adjuster configured to adjust the detection voltage;
   a signal generator configured to generate a control signal by rectifying and smoothing the detection voltage adjusted by the voltage adjuster; and
   a range setter configured to control the limit range in accordance with the control signal.

4. A controlling method of an amplifying device including a first amplifier configured to amplify an input signal, a voltage-limiting circuit configured to limit a voltage of an output signal from the first amplifier to within a limit range, and a second amplifier configured to amplify an output signal from the voltage-limiting circuit, the controlling method comprising:

controlling the limit range in accordance with a current supplied to a load from the second amplifier; and
decreasing an amplification factor of the first amplifier in a state in which the voltage-limiting circuit limits a voltage of an output signal from the first amplifier.

* * * * *